US009105486B2

(12) United States Patent
Narazaki (10) Patent No.: US 9,105,486 B2
(45) Date of Patent: Aug. 11, 2015

(54) SEMICONDUCTOR DEVICE (71) Applicant: MITSUBISHI ELECTRIC CORPORATION, Tokyo (JP)

(72) Inventor: Atsushi Narazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 14/150,477

(22) Filed: Jan. 8, 2014

(65) Prior Publication Data

US 2014/0299917 A1  Oct. 9, 2014

(30) Foreign Application Priority Data

Apr. 5, 2013  (JP) ................................. 2013-079847

(51) Int. Cl.
*H01L 29/70* (2006.01)
*H01L 29/06* (2006.01)
*H01L 29/739* (2006.01)
*H01L 29/861* (2006.01)

(52) U.S. Cl.
CPC ........ *H01L 29/0615* (2013.01); *H01L 29/0696* (2013.01); *H01L 29/7393* (2013.01); *H01L 29/7397* (2013.01); *H01L 29/8611* (2013.01)

(58) Field of Classification Search
None
See application file for complete search history.

(56) References Cited

U.S. PATENT DOCUMENTS

| 4,672,738 | A | 6/1987 | Stengl et al. | |
| 4,907,056 | A | 3/1990 | Goesele et al. | |
| 5,113,237 | A | 5/1992 | Stengl | |
| 2011/0233714 | A1* | 9/2011 | Lu ................................. | 257/493 |

FOREIGN PATENT DOCUMENTS

| JP | 61-084830 A | 4/1986 |
| JP | 01-123478 A | 5/1989 |
| JP | 02-114646 A | 4/1990 |
| JP | 02-142184 A | 5/1990 |
| JP | 07-273325 A | 10/1995 |
| JP | 2011-199223 A | 10/2011 |

OTHER PUBLICATIONS

R. Stengl et al., (1985), "Variation of Lateral Doping—A New Concept to Avoid High Voltage Breakdown of Planar Junctions", IEDM 85, pp. 154-157.
R. Stengl et al., (1986), "Variation of Lateral Doping as a Field Terminator for High-Voltage Power Devices", IEEE Transactions on Electron Devices, vol. ED-33, No. 3, pp. 426-428.

* cited by examiner

*Primary Examiner* — Fei Fei Yeung Lopez
(74) *Attorney, Agent, or Firm* — Studebaker & Brackett PC (57) ABSTRACT

A semiconductor device includes a first conductive type semiconductor substrate, a second conductive type active region formed on a top surface side of the semiconductor substrate, a second conductive type inside VLD region formed to contact the active region on the top surface side in a plan view, and a second conductive type well region formed to contact a portion opposite to the portion contacting the active region of the inside VLD region on the top surface side in a plan view. The well region is formed to be deeper than the active region. The inside VLD region has the same depth as that of the active region in the portion contacting the active region, the depth gradually increasing from the active region toward the well region and becoming the same as the depth of the well region in the portion contacting the well region.

5 Claims, 9 Drawing Sheets

FIG. 7
Comparative example

SEMICONDUCTOR DEVICE

BACKGROUND OF THE INVENTION

1. Field of the Invention

The present invention relates to a high withstand voltage semiconductor device used for high current switching or the like.

2. Background Art

Semiconductor devices for power applications such as IGBT are widely used, for example, for inverter circuits for home appliances such as air-conditioners, refrigerators or washing machines for which efforts for energy-saving are being increasingly made, motor control of rolling stock such as the Shinkansen (bullet train) or subway, control of an inverter/converter of hybrid cars or converter circuits for photovoltaic power generation or wind power generation or the like.

It is important that such semiconductor devices have stable and high withstand voltage characteristics during operation (use). For this reason, a variety of structures for alleviating an electric field in outer regions of semiconductor devices have been proposed so far. A guard ring provided in the outer region of a semiconductor device is a typical structure thereof. As another structure, Japanese Patent Laid-Open No. 61-84830 and Japanese Patent Laid-Open No. 1-123478 disclose a VLD (variation of lateral doping) region formed in the outer region. The VLD region is effective compared to the guard ring or the like in that excellent withstand voltage characteristics can be realized while reducing the area thereof.

Semiconductor devices for power applications are each provided with a device region where a device is formed on a top surface side of a semiconductor substrate and an electric field limiting region that surrounds a perimeter thereof. The range of this device region includes an active region where a main current flows as well as a portion where a control electrode pad or the like is formed when the device is a transistor, for example. When an end of the active region in a cross-sectional view is in contact with a region having a conduction type opposite to that of the active region, a PN junction having a large curvature may be formed. This is because the depth of the active region is normally determined in accordance with operating characteristics of the device, and when the depth of the active region decreases, the curvature of a PN junction increases, making it more likely to produce a problem that an electric field and a current concentrate. Therefore, the end of the active region is covered with a well region which has the same conductive type as that of the active region and which is formed deeper than the active region to prevent formation of any PN junction having a greater curvature.

However, since the well region is formed deeper than the active region, a curved portion is also formed in the portion on an inner circumferential side (active region side) of the well region, resulting in a problem that a PN junction partially having a large curvature is formed depending on a pattern shape. There is another problem that an electric field and a current concentrate on a PN junction having a large curvature.

SUMMARY OF THE INVENTION

The present invention has been implemented to solve the above-described problems, and it is an object of the present invention to provide a semiconductor device capable of solving the problem that an electric field and a current concentrate on part of a PN junction.

The feature and advantages of the present invention may be summarized as follows.

According to one aspect of the present invention, a semiconductor device includes a first conductive type semiconductor substrate, a second conductive type active region formed on a top surface side of the semiconductor substrate, a second conductive type inside VLD region formed so as to contact the active region on a top surface side of the semiconductor substrate in a plan view, and a second conductive type well region formed so as to contact a portion opposite to the portion contacting the active region of the inside VLD region on the top surface side of the semiconductor substrate in a plan view. The well region is formed to be deeper than the active region, and the inside VLD region has the same depth as that of the active region in the portion contacting the active region, the depth gradually increasing from the active region toward the well region and becoming the same as the depth of the well region in the portion contacting the well region.

Other and further objects, features and advantages of the invention will appear more fully from the following description.

DETAILED DESCRIPTION OF THE PREFERRED EMBODIMENTS

A semiconductor device according to embodiments of the present invention will be described with reference to the accompanying drawings. The same or corresponding components are assigned the same reference numerals and duplicate description may be omitted.

First Embodiment

Figure 1A:
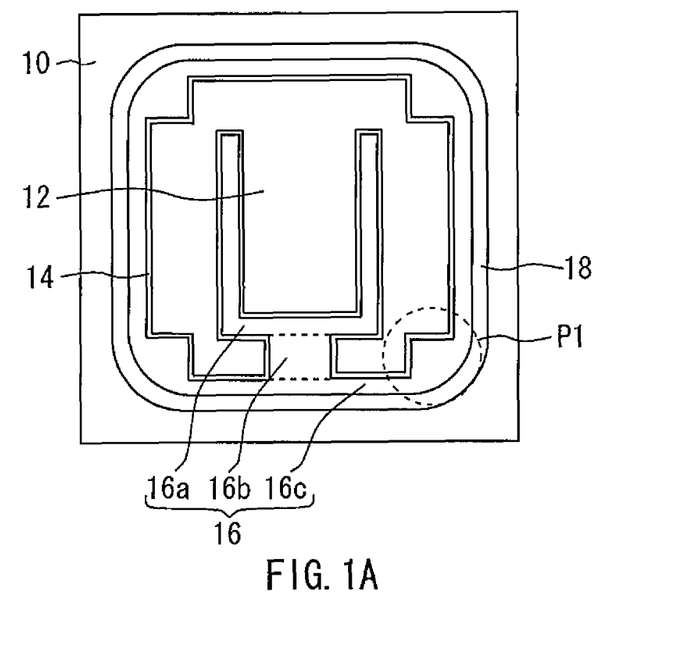
FIG. 1A is a plan view conceptually illustrating mainly a p-type region of the semiconductor device according to the first embodiment.

FIG. 1A is a plan view conceptually illustrating mainly a p-type region of the semiconductor device according to the first embodiment of the present invention. In the diagram, an insulating film and an electrode pattern on a principal surface of a semiconductor substrate (top surface of the semiconductor substrate) are omitted for convenience of description. The semiconductor device according to the first embodiment of the present invention is an IGBT having a trench gate. This semiconductor device is configured on the basis of a semiconductor substrate 10 of silicon or the like, and part of the semiconductor substrate 10 functions as an n-type drift region by using an n-type (hereinafter referred to as "first conductive type") semiconductor substrate.

A p-type (hereinafter referred to as "second conductive type") active region 12 is formed which occupies a relatively large area including a central region of the semiconductor device in a plan view on the top surface side of the semiconductor substrate 10. The active region 12 functions as a base region of the IGBT. A trench gate and an emitter region which will be described later are formed in the active region 12. Furthermore, an emitter electrode is formed on the active region 12. A second conductive type inside VLD region 14 is formed so as to contact the active region 12 in a plan view on the top surface side of the semiconductor substrate 10. The second conductive type inside VLD region 14 is a region where a second conductive type VLD (variation of lateral doping) structure is formed.

A second conductive type well region 16 is formed on the top surface side of the semiconductor substrate 10 so as to contact a portion opposite to the portion contacting the active region 12 of the inside VLD region 14 in a plan view. The well region 16 includes a first well region 16a, a second well region 16b and a third well region 16c, all of which are integrally formed. The boundary between the first well region 16a and the second well region 16b, and the boundary between the second well region 16b and the third well region 16c are shown by a broken line. The first well region 16a corresponds to a portion provided with a gate finger and the second well region 16b corresponds to a portion provided with a gate pad.

An outside VLD region 18 is provided on an outer region of the third well region 16c. The outside VLD region 18 contacts the third well region 16c while surrounding the active region 12, the inside VLD region 14 and the well region 16. The outside VLD region 18 is a region that functions as a known withstand voltage retaining structure formed on an outer circumferential side of the semiconductor substrate 10.

Figure 1B:
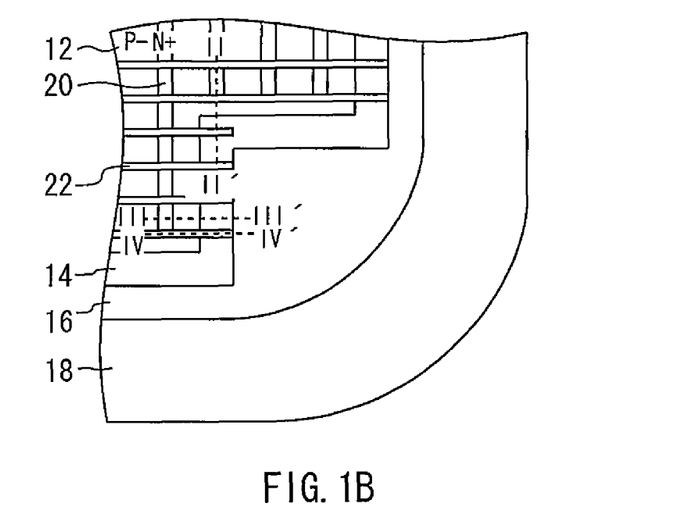
FIG. 1B is an enlarged plan view of a region P1 enclosed by a broken line in FIG. 1A.

FIG. 1B is an enlarged plan view of a region P1 enclosed by a broken line in FIG. 1A. A first conductive type emitter region 20 is formed in contact with the active region 12. A plurality of emitter regions 20 are formed rectilinearly in a plan view. A plurality of trench gates 22 are formed which extend rectilinearly from the active region 12 to the inside VLD region 14 or the well region 16 in a plan view. The trench gate 22 is orthogonal to the emitter region 20. The trench gate 22 is electrically connected to the gate pad via the gate finger so as to receive a drive signal.

Figure 2:
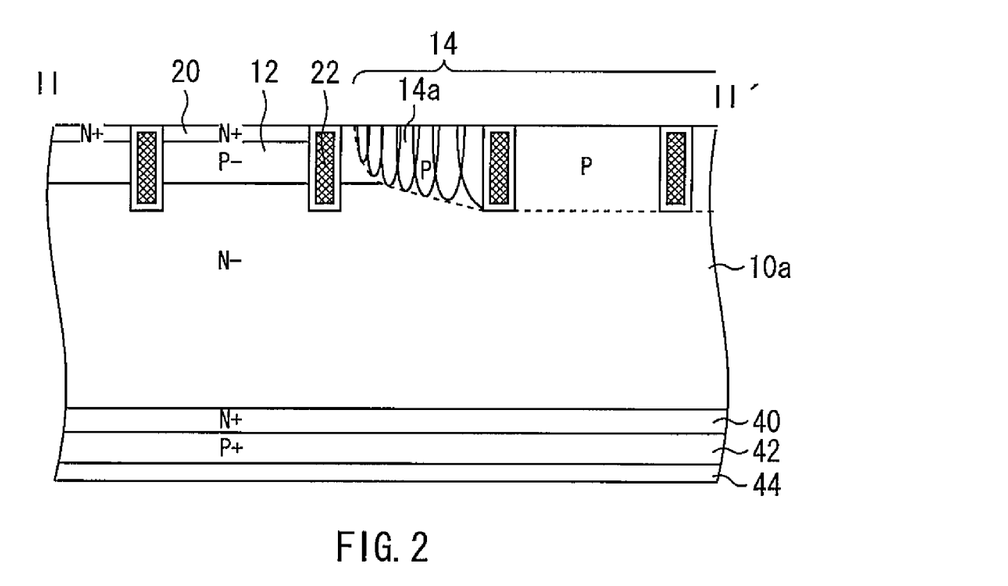
FIG. 2 is a cross-sectional view along a broken line II-II' in FIG. 1B.

FIG. 2 is a cross-sectional view along a broken line II-II' in FIG. 1B. The emitter region 20 is formed to be shallower than the active region 12. The trench gate 22 is deeper than the active region 12, that is, formed so as to penetrate the active region 12. The inside VLD region 14 is formed of a plurality of second conductive type layers 14a which overlap each other in the lateral direction. An envelope of the plurality of second conductive type layers 14a is shown by a broken line. A contour of the second conductive type region formed of the inside VLD region 14 matches the envelope. A first conductive type buffer region 40, a second conductive type collector region 42 and a collector electrode 44 are formed on an undersurface side of a drift region 10a of the semiconductor substrate 10.

Figure 3:
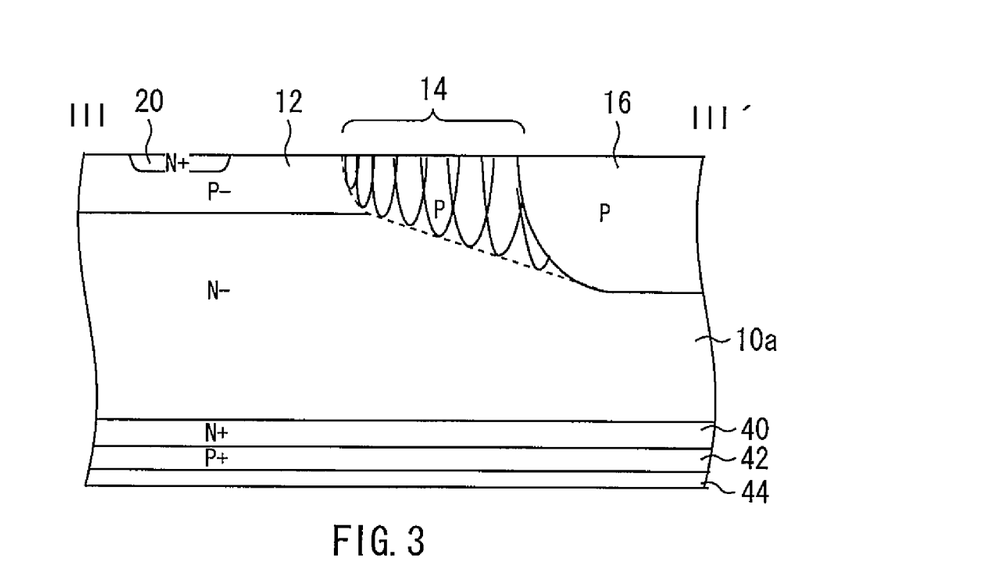
FIG. 3 is a cross-sectional view along a broken line III-III' in FIG. 1B.

FIG. 3 is a cross-sectional view along a broken line III-III' in FIG. 1B. The well region 16 is deeper than the active region 12 and formed so as to have a higher impurity concentration than the active region 12. The inside VLD region 14 has the same depth as that of the active region 12 in a portion contacting the active region 12, the depth gradually increasing from the active region 12 toward the well region 16 and becoming the same depth as that of the well region 16 in a portion contacting the well region 16. Furthermore, the impurity concentration of the inside VLD region 14 gradually increases from the active region 12 side toward the well region 16 side.

Figure 4:
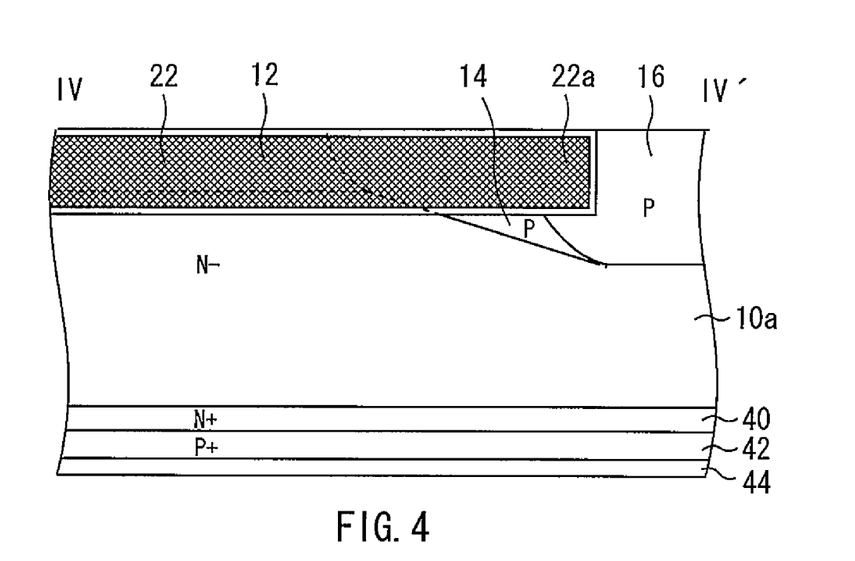
FIG. 4 is a cross-sectional view along a broken line IV-IV' in FIG. 1B.

FIG. 4 is a cross-sectional view along a broken line IV-IV' in FIG. 1B. The trench gate 22 is formed so as to be shallower than the well region 16. An end 22a of the trench gate 22 is covered with (included in) the inside VLD region 14 or the well region 16 so as not to contact the drift region 10a of the semiconductor substrate 10. Note that for reference, the active region 12 and the inside VLD region 14 are shown by a broken line to clarify the positional relationship with the trench gate 22 or the like.

Figure 5:
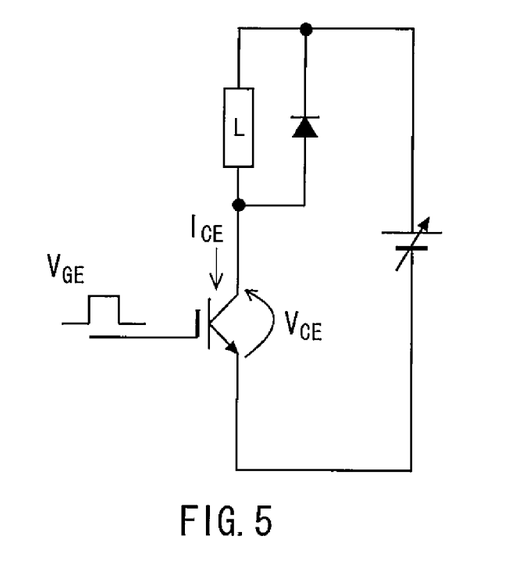
FIG. 5 is a circuit diagram including the semiconductor device according to first embodiment.
Figure 6:
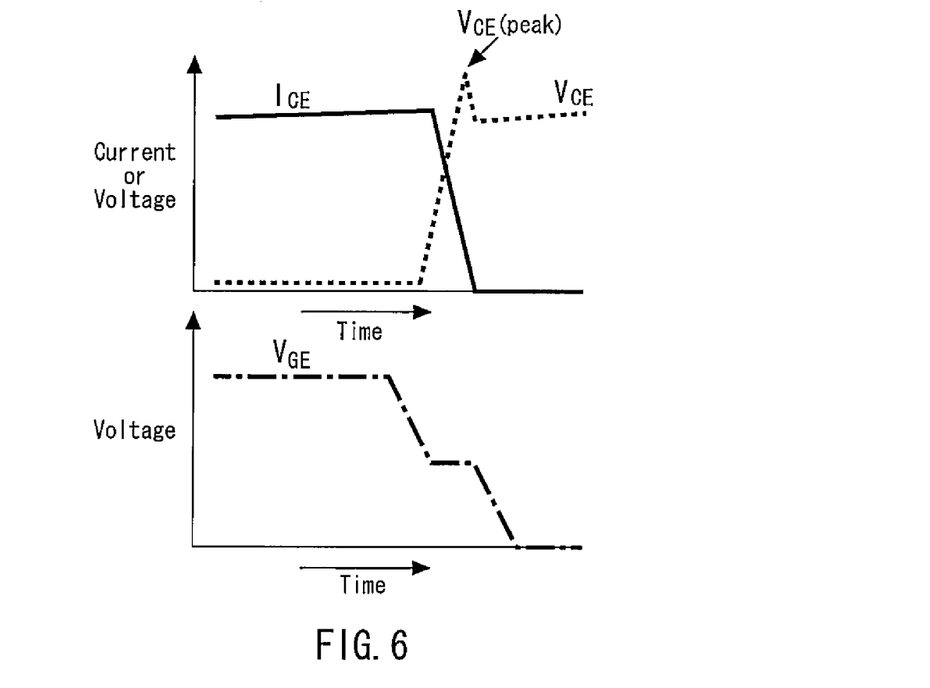
FIG. 6 shows an operation waveform when the IGBT is turned off in the circuit shown in FIG. 5.

A case will be described where the semiconductor device according to first embodiment of the present invention is used as a circuit element shown in FIG. 5. FIG. 5 is a circuit diagram including an IGBT which is the semiconductor device according to first embodiment of the present invention. This circuit is a switching circuit with L load (inductance). In such a circuit, a collector-emitter voltage ($V_{CE}$) increases when the semiconductor device is turned off. FIG. 6 shows an operation waveform when the IGBT which is the semiconductor device is turned off in the circuit shown in FIG. 5, showing that a $V_{CE}$ (peak) appears. When the semiconductor device is turned off, the $V_{CE}$ rises accompanied by a drop of a gate voltage and a current ($I_{CE}$) that flows through the semiconductor device decreases. When the $V_{CE}$ rises and reaches a maximum value ($V_{CE}$(peak)), an electric field generated in the semiconductor device becomes strongest.

Figure 7:
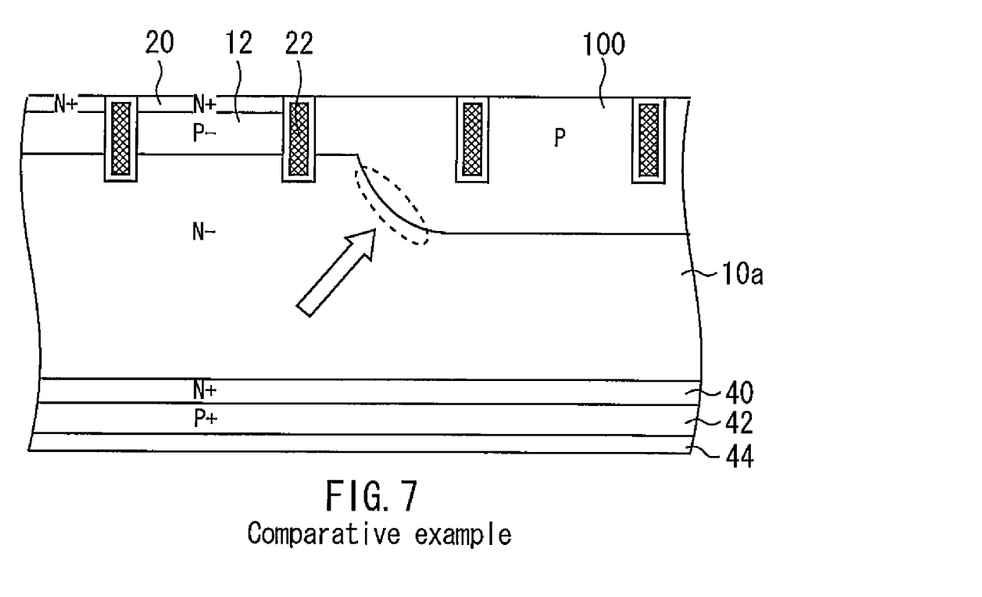
FIG. 7 is a cross-sectional view of the semiconductor device according to the comparative example.

To facilitate an understanding of the semiconductor device according to the first embodiment of the present invention, a semiconductor device according to a comparative example will be described. FIG. 7 is a cross-sectional view of the semiconductor device according to the comparative example. FIG. 7 is similar to the cross-sectional view in FIG. 2, but is different from the cross-sectional view in FIG. 2 in that no inside VLD region is formed. In the semiconductor device of the comparative example, the active region 12 directly contacts the well region 100. For this reason, a portion of the well region 100 on the active region 12 side having a large curvature (shown by a broken line) contacts the semiconductor substrate 10, and therefore a PN junction having a large curvature is formed.

For example, in a RBSOA (reverse biased safe operating area) test or the like, when a current is shut off from a high current carrying state, holes in the semiconductor substrate (drift region) flow into a region where a strong electric field is generated in a concentrated manner. This carrier flow becomes a hole current. When this test is conducted on the semiconductor device of this comparative example, the electric field in the portion shown by a broken line in FIG. 7 increases and the hole current concentrates on this portion. In this way, if the temperature in this portion rises, for example, to the order of 600 K (Kelvin), the device may receive a considerable damage.

However, the semiconductor device according to Embodiment 1 of the present invention can prevent the electric field and current from concentrating on part of the PN junction composed of the well region 16. The inside VLD region 14 according to the first embodiment of the present invention has the same depth as that of the active region 12 in a portion contacting the active region 12, the depth thereof gradually increasing from the active region 12 toward the well region 16 and becoming the same depth as that of the well region 16 in the portion contacting the well region 16. Furthermore, an impurity concentration thereof gradually increases from the active region 12 side toward the well region 16 side. This prevents the well region 16 from forming a PN junction with a large curvature, and can thereby solve the problem of the electric field and current concentrating on part of the PN junction.

Figure 8:
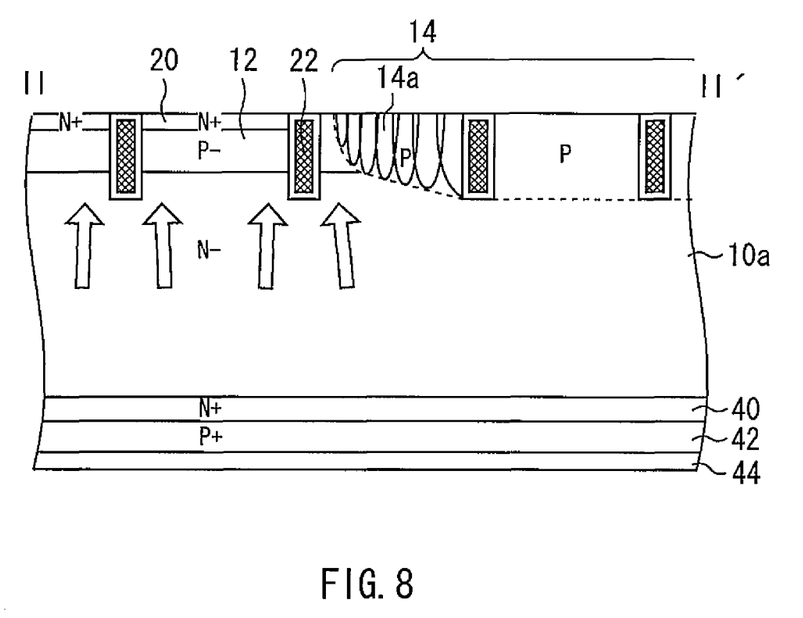
FIG. 8 is a diagram illustrating a current route at the time of VCE (peak)

FIG. 8 is a diagram illustrating a current route at the time of $V_{CE}$ (peak). Hole currents are shown by arrows. Hole currents at the time of $V_{CE}$ (peak) do not concentrate on the well region, but flow into the emitter region 20 via the active region 12. Since the active region 12 is formed to be wide, hole currents can be scattered by causing the hole currents to pass through the active region 12. It is thereby possible to improve reliability of the semiconductor device.

In the semiconductor device according to the first embodiment of the present invention, the inside VLD region 14 is formed between the well region 16 and the active region 12, and there is no part where the well region 16 directly contacts the active region 12, providing an effect of improving reliability of the semiconductor device. Compared to the comparative example, quite a small hole current flows into the well region 16, but since the well region 16 is a region having low resistance, the hole currents cause little heat generation.

Since the end of the trench gate 22 is covered with the inside VLD region 14 or the well region 16, the end of the trench gate 22 does not contact the semiconductor substrate 10. This prevents the electric field in the corner of the end of the trench gate 22 from increasing, causing the withstand voltage to drop.

Figure 9A:
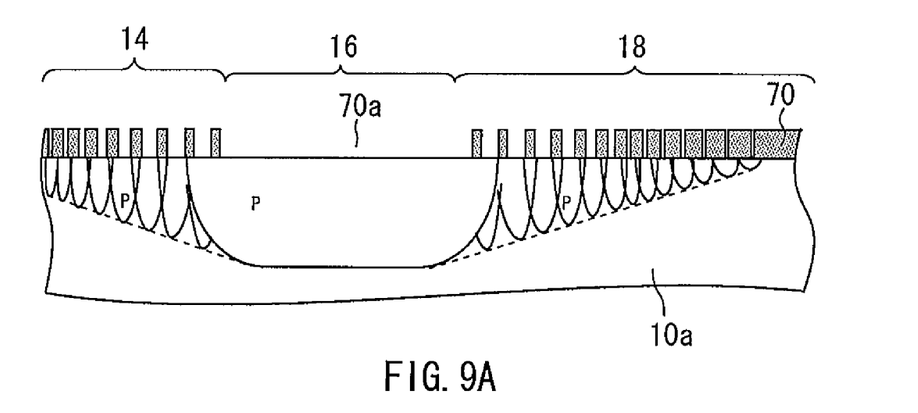
FIG. 9A is a cross-sectional view illustrating the oxide film.
Figure 9B:
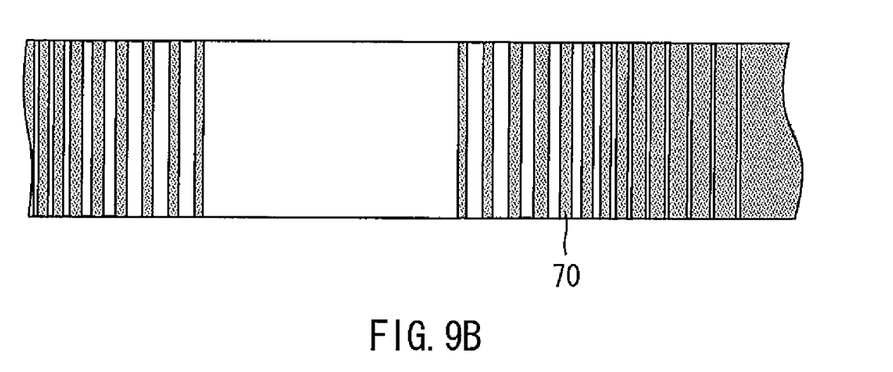
FIG. 9B is a plan view illustrating the oxide film.

The inside VLD region 14, the well region 16 and the outside VLD region 18 (withstand voltage retaining region) can be formed by single ion injection. In this case, it is possible to avoid an increase in the number of steps caused by providing the inside VLD region 14. FIG. 9 shows a cross-sectional view and a plan view illustrating that the inside VLD region, the well region and the outside VLD region are formed by single ion injection so as to simultaneously form these components. FIG. 9A is a cross-sectional view and FIG. 9B is a plan view.

A method for manufacturing the inside VLD region 14, the well region 16 and the outside VLD region 18 will be described briefly. First, an oxide film is provided on the semiconductor substrate 10, and an oxide film 70 having a plurality of striped openings in a plan view is formed using a photoengraving process technique. The greater the distance from the opening 70a for forming the well region 16, the smaller the width and the opening density of the plurality of openings become. Impurity such as boron is then injected using the oxide film 70 as a mask. After that, heat treatment is applied to activate the impurity. This allows the inside VLD region 14, the well region 16 and the outside VLD region 18 (withstand voltage retaining region) to be formed by single ion injection and heat treatment, which improves efficiency. In this case, the inside VLD region 14 becomes a region where a plurality of striped regions overlap each other in a plan view.

Figure 10A:
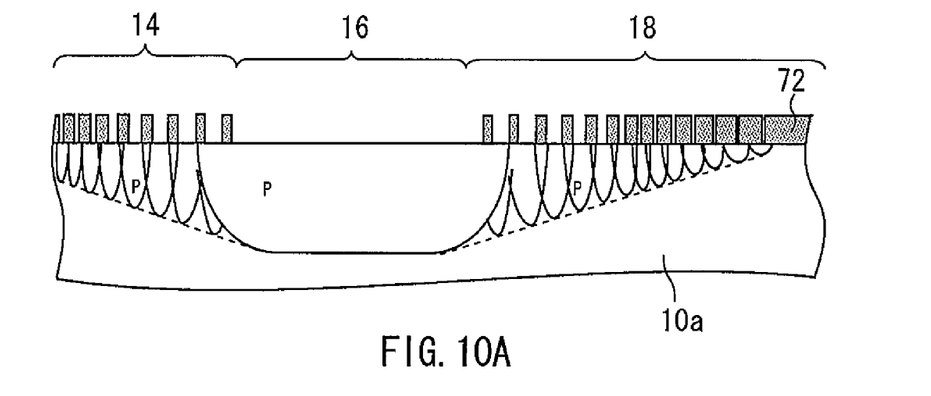
FIG. 10A is a cross-sectional view illustrating the oxide film.
Figure 10B:
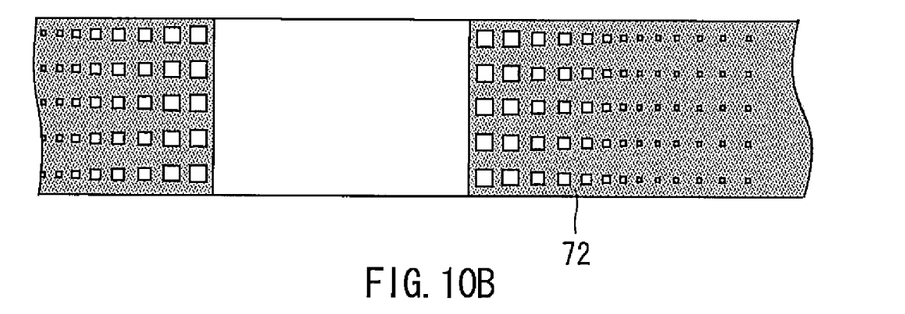
FIG. 10B is a plan view illustrating the oxide film.

Spotted openings may also be formed in the oxide film to be used as a mask. FIG. 10 is a cross-sectional view and a plan view illustrating the oxide film having a plurality of spotted openings. FIG. 10A is a cross-sectional view and FIG. 10B is a plan view. The oxide film 72 has a plurality of spotted openings in a plan view. By applying ion injection and heat treatment to the semiconductor substrate 10 using the oxide film 72 as a mask, it is possible to form an inside VLD region where a plurality of spotted regions overlap each other in a plan view. In this case, adjusting the sizes of the openings of the oxide film 72 makes it possible to finely adjust impurity concentrations of the inside VLD region and the outside VLD region. Note that an oxide film provided with both striped portions and spotted portions may also be formed.

The semiconductor device according to the first embodiment of the present invention is intended to prevent concentration of hole currents on the well region when a positive potential is applied to the collector electrode relative to the emitter electrode. Therefore, the semiconductor device according to the first embodiment of the present invention also has an effect when applying a voltage such as a high temperature reverse bias test (HTRB) all the time in addition to when shutting off a high current as described above.

The conductive types of the aforementioned regions may be reversed. That is, although the n-type is assumed to be the first conductive type and the p-type is assumed to be the second conductive type, the p-type may be the first conductive type and the n-type may be the second conductive type.

The trench gate 22 may extend from the active region 12 to the inside VLD region 14 in a plan view or extend from the active region 12 to the well region 16. In either case, it is preferable to prevent the end of the trench gate 22 from contacting the semiconductor substrate 10 of the first conductive type.

The outside VLD region 18 may be replaced by a withstand voltage retaining region other than the VLD structure. An electric field limiting region such as a guard ring or a RESURF structure may be formed instead of the outside VLD region 18. A known channel stopper region is preferably formed on the outermost circumference of the semiconductor device.

The semiconductor device according to the first embodiment of the present invention is not limited to the IGBT, but may also be a power MOSFET, semiconductor device having a planer gate structure, LSI or diode. Note that these modifications may also be applicable to semiconductor devices according to the following embodiments as appropriate.

Second Embodiment

Figure 11:
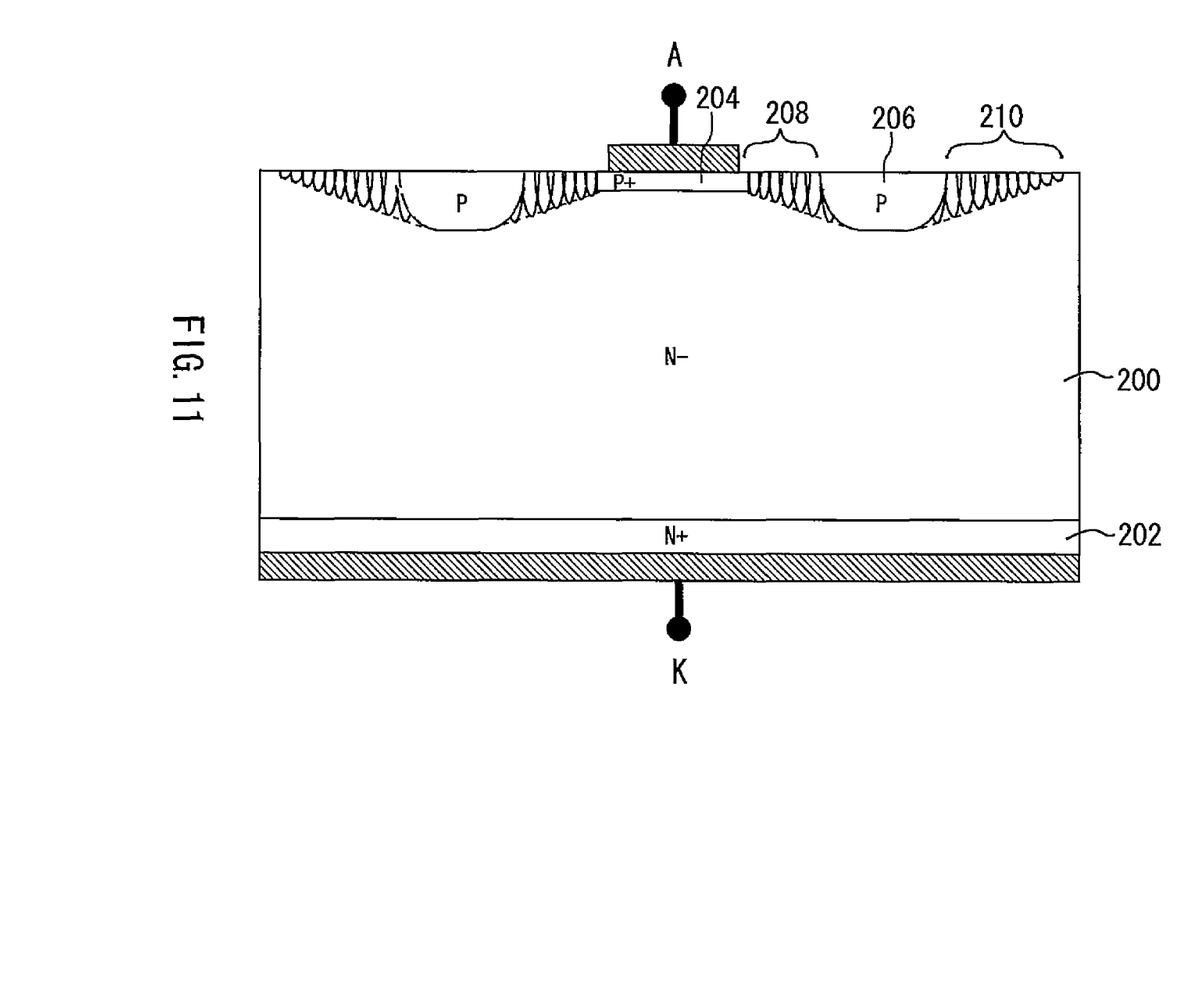
FIG. 11 is a cross-sectional view of a semiconductor device according to the second embodiment.

FIG. 11 is a cross-sectional view of a semiconductor device according to a second embodiment of the present invention. The semiconductor device according to the second embodiment of the present invention is a diode. A first conductive type cathode region 202 is formed on an undersurface side of a first conductive type semiconductor substrate 200. A second conductive type active region 204 that functions as an anode region is formed on the top surface side of the semiconductor substrate 200.

A well region 206 which is deeper than the active region 204 is formed so as to surround the active region 204 in a plan view on a top surface side of the semiconductor substrate 200. Since the well region 206 has low resistance and is effective in suppressing heat generation, it is formed to be deeper than the active region 204. The well region 206 and the active region 204 are connected at an inside VLD region 208. The depth of the inside VLD region 208 is similar to that of the first embodiment. An outside VLD region 210 is formed outside the well region 206.

Forming the inside VLD region 208 between the active region 204 and the well region 206 allows a diode having an effect similar to that of the first embodiment to be manufactured.

Third Embodiment

Figure 12A:
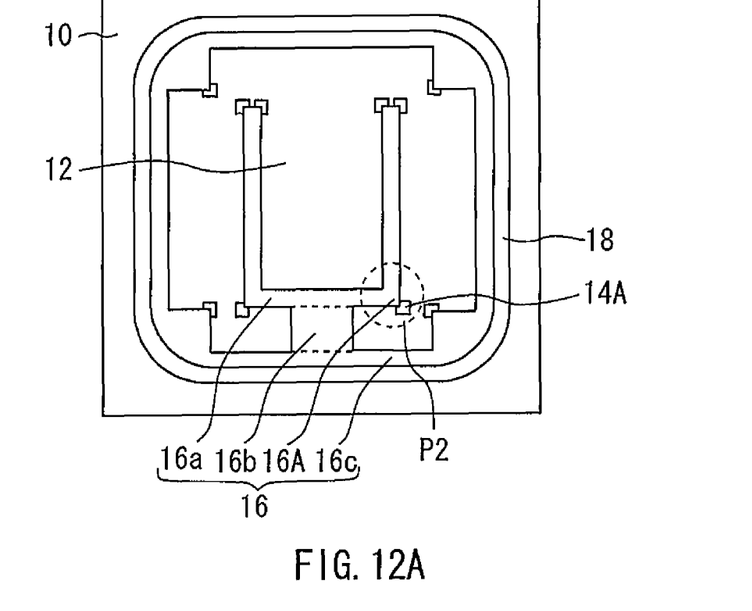
FIG. 12A is a plan view of the semiconductor device according to the third embodiment.

Since a semiconductor device according to a third embodiment of the present invention has many aspects common to those of the first embodiment, description will be focused on differences from the first embodiment. FIG. 12A is a plan view of the semiconductor device according to the third embodiment of the present invention. The semiconductor device according to the third embodiment of the present invention is different from the first embodiment in that an inside VLD region 14A is partially formed.

Figure 12B:
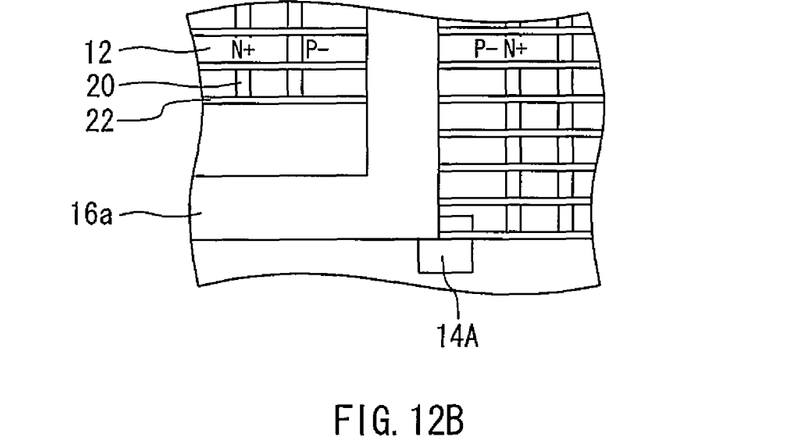
FIG. 12B is an enlarged plan view of a region P2 enclosed by a broken line in FIG. 12A.

A well region 16 formed on a top surface side of the semiconductor substrate 10 has a plurality of convex portions 16A in a plan view. The convex portion 16A is a portion of the well region 16 protruding toward the active region 12 in a plan view. The well region 16 contacts the active region 12 at portions other than the convex portion 16A. The second conductive type inside VLD region 14A is formed so as to contact the convex portion 16A and the active region 12. That is, the convex portion 16A and the active region 12 are connected via the inside VLD region 14A. FIG. 12B is an enlarged plan view of a region P2 enclosed by a broken line in FIG. 12A.

The inside VLD region 14A has the same depth as that of the active region 12 in the portion contacting the active region 12, the depth gradually increasing from the active region 12 toward the convex portion 16A and becoming the same as the depth of the convex portion 16A in the portion contacting the convex portion 16A.

The convex portion 16A is the region having the largest curvature in the well region 16. Providing the inside VLD region 14A so as to contact the convex portion 16A makes it possible to prevent concentration of the electric field on the convex portion 16A and prevent a current from flowing in a localized manner.

According to the present invention, it is possible to solve the problem that an electric field and a current concentrate on part of a PN junction.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-079847, filed on Apr. 5, 2013 including specification, claims, drawings and summary, on which the Convention priority of the present application is based, is incorporated herein by reference in its entirety.

What is claimed is:

1. A semiconductor device comprising:
   a first conductive type semiconductor substrate;
   a second conductive type active region formed on a top surface side of the semiconductor substrate;
   a second conductive type inside VLD region formed so as to contact the active region on a top surface side of the semiconductor substrate in a plan view; and
   a second conductive type well region formed so as to contact a portion opposite to the portion contacting the active region of the inside VLD region on the top surface side of the semiconductor substrate in a plan view,
   wherein the well region is formed to be deeper than the active region, and
   the inside VLD region has the same depth as that of the active region in the portion contacting the active region, the depth gradually increasing from the active region toward the well region and becoming the same as the depth of the well region in the portion contacting the well region.

2. The semiconductor device according to claim 1, further comprising:
   a first conductive type emitter region formed in part of the active region so as to be shallower than the active region;
   a trench gate that extends from the active region to the inside VLD region or the well region in a plan view and is formed so as to be deeper than the active region and shallower than the well region; and
   a second conductive type collector region formed on an undersurface side of the semiconductor substrate,
   wherein the active region is a base region, and
   an end of the trench gate is covered with the inside VLD region or the well region so as not to contact the semiconductor substrate.

3. The semiconductor device according to claim 1, further comprising a first conductive type cathode region formed on an undersurface side of the semiconductor substrate,
   wherein the active region is an anode region, and
   the semiconductor device constitutes a diode.

4. The semiconductor device according to claim 1, wherein the inside VLD region is a region where a plurality of spotted regions overlap each other in a plan view or a region where a plurality of striped regions overlap each other in a plan view.

5. A semiconductor device comprising:
   a first conductive type semiconductor substrate;
   a second conductive type active region formed on a top surface side of the semiconductor substrate;
   a second conductive type well region having a convex portion in a plan view and formed so as to contact the active region on a top surface side of the semiconductor substrate at a portion other than the convex portion; and
   a second conductive type inside VLD region formed on a top surface side of the semiconductor substrate so as to contact the convex portion and the active region in a plan view,
   wherein the well region is formed to be deeper than the active region, and
   the inside VLD region has the same depth as that of the active region in the portion contacting the active region, the depth gradually increasing from the active region toward the convex portion and becoming the same as the depth of the convex portion in the portion contacting the convex portion.

* * * * *